(12) United States Patent
Oehm

(10) Patent No.: US 7,579,815 B2
(45) Date of Patent: Aug. 25, 2009

(54) CURRENT CONTROLLING CIRCUIT ARRANGEMENT AND ASSOCIATED METHOD FOR REDUCING CROSSTALK

(75) Inventor: Juergen Oehm, Ratingen (DE)

(73) Assignee: Infineon Technologies AG, Munich (DE)

( * ) Notice: Subject to any disclaimer, the term of this patent is extended or adjusted under 35 U.S.C. 154(b) by 384 days.

(21) Appl. No.: 11/067,803

(22) Filed: Feb. 28, 2005

(65) Prior Publication Data

US 2005/0194943 A1 Sep. 8, 2005

(30) Foreign Application Priority Data

Mar. 2, 2004 (DE) ............... 10 2004 010 169

(51) Int. Cl.
*G05F 1/00* (2006.01)

(52) U.S. Cl. ............... 323/273; 323/274; 323/277; 307/52

(58) Field of Classification Search ............... 323/273, 323/274, 277, 280, 312, 349; 307/52; 379/416, 379/417; 327/382
See application file for complete search history.

(56) References Cited

U.S. PATENT DOCUMENTS

| | | | | |
|---|---|---|---|---|
| 5,532,913 | A * | 7/1996 | Suzuki et al. ............... | 363/25 |
| 5,736,949 | A * | 4/1998 | Ong et al. ............... | 341/141 |
| 5,796,306 | A * | 8/1998 | Tsumura ............... | 330/124 R |
| 6,668,232 | B2 * | 12/2003 | Ennis et al. ............... | 702/60 |
| 6,765,811 | B1 * | 7/2004 | Chang ............... | 363/39 |
| 2001/0017537 | A1 * | 8/2001 | Antheunis ............... | 323/312 |
| 2002/0017897 | A1 * | 2/2002 | Wilcox et al. ............... | 323/282 |
| 2002/0171403 | A1 * | 11/2002 | Lopata ............... | 323/280 |
| 2004/0046532 | A1 * | 3/2004 | Menegoli et al. ............... | 323/273 |

FOREIGN PATENT DOCUMENTS

DE    41 10 633 C2    10/1991

* cited by examiner

*Primary Examiner*—Akm E Ullah
*Assistant Examiner*—Arun Williams
(74) *Attorney, Agent, or Firm*—Eschweiler & Associates, LLC

(57) ABSTRACT

A circuit arrangement and associated method for reducing crosstalk are disclosed. A load impedance is connected via a controlled current source to an input connection for supplying a supply voltage (Vin) in the circuit arrangement. The current source is actuated using a control means such that the current source outputs a current which corresponds to the average current drawn by the load impedance. In this manner, merely a small voltage drop occurs on the supply voltage while radio-frequency interference is concurrently mitigated.

21 Claims, 3 Drawing Sheets

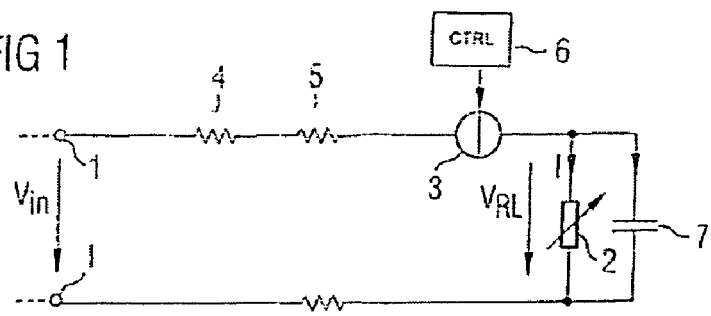
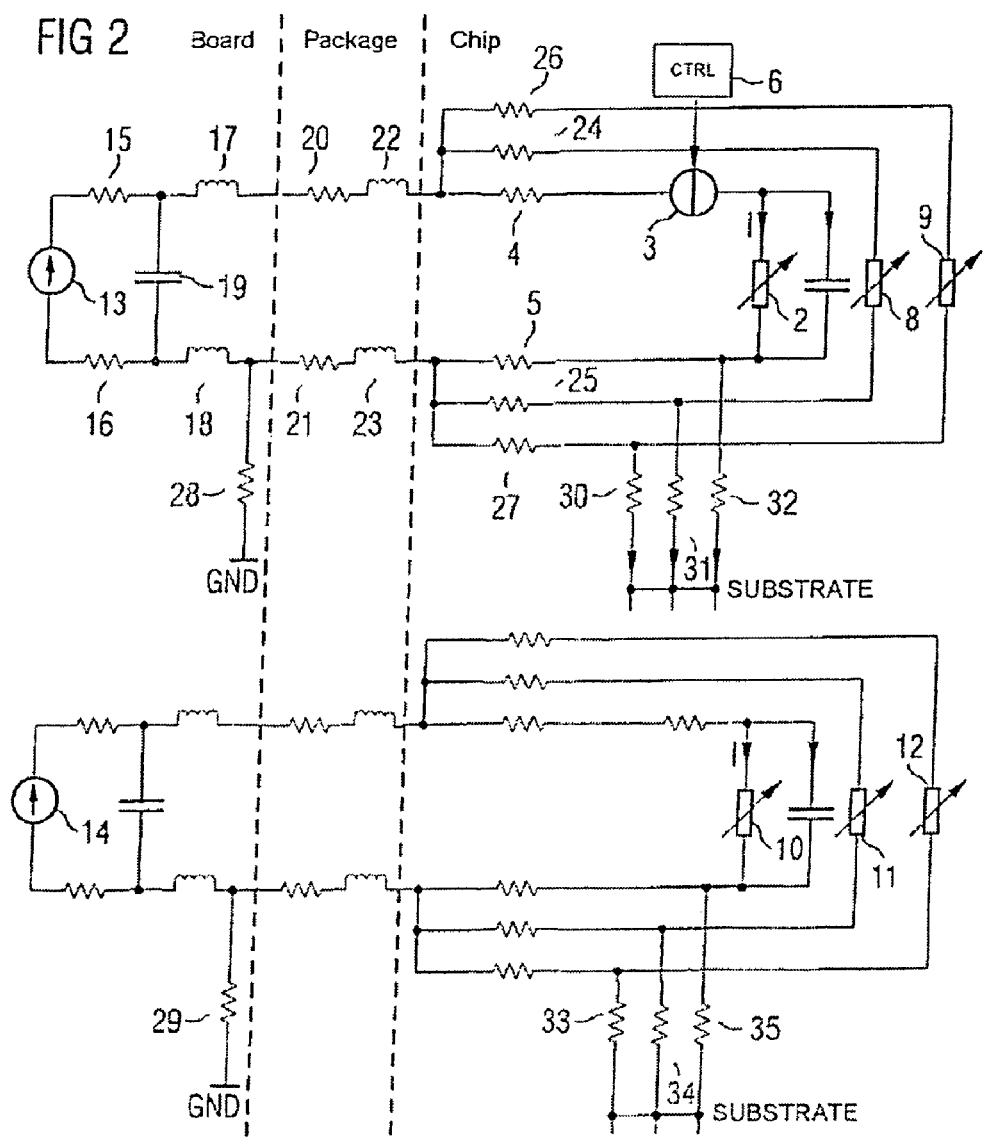

CURRENT CONTROLLING CIRCUIT ARRANGEMENT AND ASSOCIATED METHOD FOR REDUCING CROSSTALK

REFERENCE TO RELATED APPLICATIONS

This application claims the benefit of the priority date of German application DE 10 2004 010 169.8, filed on Mar. 2, 2004, the contents of which are herein incorporated by reference in their entirety.

FIELD OF THE INVENTION

The present invention relates to a circuit arrangement, the use thereof on a chip and a method for reducing crosstalk.

BACKGROUND OF THE INVENTION

In integrated semiconductor circuits, crosstalk from interference on power supply systems between function groups which are monolithically integrated together is undesirable. To reduce crosstalk effects via power supply systems, it is normal practice to take passive measures. One such measure is capacitive backup of the supply voltage, for example.

Voltage drops across bonding wires and voltage drops across parasitic series inductances in the power supply line as a result of high-frequency and very high-frequency fluctuations in the current carried by on-chip loads cannot be compensated for by a backup capacitor on the board which stabilizes the supply voltage. Even metal, on-chip supply lines to the loads on the chip have non-negligible series resistances. Since integrated structures have parasitic connections to the silicon substrate, it becomes clear that relatively high-frequency transient dynamic load changes in integrated loads result in more or less pronounced transient couplings between the connections of the loads. This means that there is undesirable crosstalk from signals or interference on supply voltages.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

One or more aspects of the present invention pertain to a circuit arrangement and a method for reducing crosstalk which can be used in integrated semiconductor circuits to achieve high interference suppression values.

A circuit arrangement for reducing crosstalk according to one or more aspects of the present invention includes an input connection for supplying a supply voltage (Vin). The arrangement also includes a load impedance and a controlled current source which is coupled between the input connection of the circuit arrangement and the load impedance. Further, the arrangement includes a control means which has an output coupled to a control input on the controlled current source such that the controlled current source outputs a current which corresponds to the average current drawn by the load impedance.

A method for reducing crosstalk according to one or more aspects of the present invention includes providing a load impedance and supplying a supply voltage (Vin) to the load impedance. The method also includes controlling a current through the load impedance such that the current corresponds to an average current drawn by the load impedance.

A controlled current source is coupled between an input connection for supplying a supply voltage and a load impedance. The controlled current source is actuated such that it outputs a current which corresponds to the average current drawn by the load impedance. This average current through the load impedance which is output by the controlled current source can easily be set. This means that relatively high-frequency spikes in the current carried are no longer present in the supply current through the load impedance. This means that the potentials at the connecting nodes for the load impedance are also no longer affected by periodic changes in the current drawn by the load.

Additionally, relatively high interference suppression values can also be attained in the range of audio-frequency interference frequencies, and the voltage loss in the supply voltage for the load impedance is relatively small compared to conventional broadband blocking measures.

Advantageously, the control means preferably comprises a control capacitor which is coupled between the control input of the controlled current source and the input connection of the circuit arrangement. The control capacitor is a simple way of providing a control signal for the controlled current source. It is thus possible, with particularly little complexity, for the controlled current source to produce a current which corresponds to the average current drawn by the load impedance.

The controlled current source is preferably constructed using a transistor, where the control connection of the transistor is the control input of the controlled current source. The controlled path of the transistor is connected between the input connection of the circuit arrangement and the load impedance. The transistor is preferably a metal oxide semiconductor (MOS) transistor.

The load impedance preferably has a backup capacitor connected in parallel with it. This suppresses crosstalk even further. Brief current spikes in the current drawn by the load are provided from the backup capacitor.

The backup capacitor is preferably proportioned such that it is not excessively charged and discharged by dynamic changes in the current drawn by the load impedance. The backup capacitor is preferably proportioned such that the ripple on the voltage drop across the load impedance is not too great.

The backup capacitor is preferably in the form of a metal oxide semiconductor transistor. In this case, the capacitance of the transistor between the gate and channel is utilized.

To control the controlled current source, the control means preferably comprises a differential amplifier. One input of the differential amplifier is preferably coupled to that load connection of the controlled current source which is coupled to the load impedance. A further input on the differential amplifier is used to supply a reference signal. The output of the differential amplifier is connected to the control input of the controlled current source. This provides a control loop which regulates the average current through the load impedance.

The reference variable for this control loop, namely the reference signal, is preferably provided at a value which is such that the transistor in the controlled current source operates just as a current source.

The controlled current source's connection which is coupled to the load impedance is preferably coupled to a connection on the load impedance itself via a resistor.

To generate the reference signal, there is preferably a reference signal generator which is coupled to the input connection of the circuit arrangement and outputs the reference signal on the basis of the supply voltage for the circuit arrangement.

The reference signal generator may comprise, by way of example, a series circuit containing a resistor and a current source which is connected between input terminals on the circuit arrangement in order to supply a supply voltage. This means that the reference signal takes the supply voltage as reference.

The differential amplifier is advantageously equipped with a gradient which gives rise to a control time constant which matches the change in the average current drawn by the load impedance over time.

To facilitate a speedy transient process at the same time, there is preferably a further differential amplifier. The first and second inputs of the further differential amplifier are respectively connected to the first and second inputs of the differential amplifier. The output of the further differential amplifier is connected to the control input of the controlled current source via a switch. The switch can therefore be closed in order to provide a speedy transient process and can be opened again when the transient process has finished. This means that the advantage of rapid settling is associated with a broadband blocking action after the switch has been opened.

The differential amplifier preferably has a shallower gradient than the further differential amplifier. The control time constant is inversely proportionally dependent on the gradient in this case.

If the control means comprises a control capacitor, the control time constant is proportional to the value of the control capacitor at the control input of the controlled current source.

The circuit arrangement is preferably monolithically integrated.

Preferably, a plurality of circuit arrangements are provided on a chip and are associated with respective load impedances. In this manner, the load impedances can be operated at different and/or the same supply voltages and undesirable radiated interference from transient radio-frequency interference on the common substrate can be suppressed.

One or more aspects of the present invention significantly reduce crosstalk by providing not a passive but rather an active measure to reduce crosstalk effects via the supply voltage. This is done by controlling the current flowing through the load impedance such that the current corresponds to an average current drawn by the load impedance.

The average current drawn by the load impedance is advantageously controlled on the basis of the supply voltage. This is preferably done by means of capacitive coupling. In this case, the supply voltage is preferably filtered using a series capacitor and is used to control the average current drawn by the load impedance.

The current through the load impedance is preferably controlled using a transistor. In this case, the current to be controlled preferably flows through the controlled path of the transistor.

The voltage across the load impedance preferably has capacitive backup.

The capacitive backup for the voltage across the load impedance is preferably provided by means of a metal oxide semiconductor transistor operating as a capacitor.

The current through the load impedance is controlled based on a signal that is preferably provided by comparing a voltage drop across the load impedance with a reference voltage.

Alternatively, the reference voltage is preferably generated such that the transistor controlling the current through the load impedance operates as a current source. The reference voltage accordingly stipulates the operating point of the transistor such that the transistor still operates in current source mode.

If the transistor is a MOS transistor, this means that the reference voltage is set such that the drain/source voltage drop across the transistor is just large enough for the transistor to be regarded as a current source in a good approximation. The approximately static drain current through the transistor then corresponds to the average current drawn by the analog load, namely the load impedance.

The reference voltage is preferably provided on the basis of the supply voltage.

The load impedance may be either a digital function block or an analog function block or may be a discrete component designed using digital circuitry or an analog component integrated using analog circuitry. The proposed principle is used to particular advantage when the load impedance is subject to fluctuations over time.

BRIEF DESCRIPTION OF THE DRAWINGS

The invention is explained in more detail below wherein reference is made to the following drawings.

FIG. 1 is a schematic block diagram illustrating an exemplary circuit arrangement according to one or more aspects of the present invention.

FIG. 2 is a schematic block diagram illustrating an exemplary circuit arrangement according to one or more aspects of the present invention where crosstalk paths from interference on a supply voltage are also depicted.

DETAILED DESCRIPTION OF THE INVENTION

Figure 3:
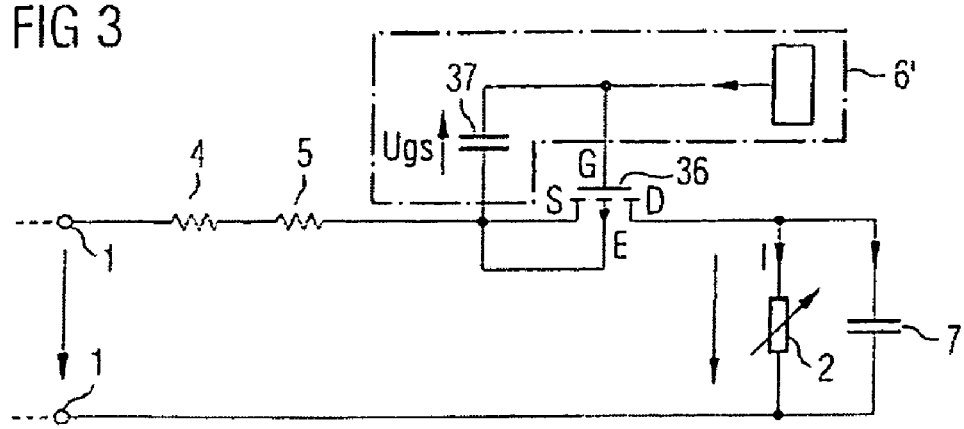
FIG. 3 is a schematic block diagram illustrating an exemplary circuit arrangement similar to that of FIG. 1 wherein a MOS transistor is implemented.

One or more aspects of the present invention will now be described with reference to the drawing figures, wherein like reference numerals are used to refer to like elements throughout. It should be understood that the drawing figures and following descriptions are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details. Thus, it will be appreciated that variations of the illustrated systems and methods apart from those illustrated and described herein may exist and that such variations are deemed as falling within the scope of the present invention and the appended claims.

FIG. 1 illustrates a circuit arrangement according to one or more aspects of the present inventor, where an input connection 1 of the arrangement having two terminals can have a supply voltage Vin supplied to it. This feeds a load impedance 2, which may have a variable value and serves as electrical load. To couple the input connection 1 and the load impedance 2, a supply path contains a controlled current source 3. In addition, resistors 4, 5 are shown which represent the parasitic properties of the supply line. A control means 6 (CTRL) has its output coupled to a control input on the controlled current source 3 such that the controlled current source 3 outputs a current which corresponds to the average current drawn by the load impedance 2. The load impedance 2 has a backup capacitor 7 connected in parallel with it. Further connections on the load impedance 2 and on the backup capacitor 7 are connected directly to one of the two terminals of the input connection 1.

The resistors 4, 5 represent on-chip supply line resistances. The current source 3 provides a current which corresponds to the average current drawn by the load 2. In this case, the average current value is set by the control means 6. As a result, relatively high-frequency spikes in the current carried are no longer present in proportion in the current flowing through the load impedance 2. This means that the potentials at the connecting nodes for the input of the circuit are also no longer affected by periodic changes in the current drawn by the load impedance 2. In addition, the backup capacitor 7 is proportioned to be of a size such that it is not excessively charged and discharged as a result of dynamic changes in the current drawn by the load impedance. This mitigates ripple on the voltage drop across the load impedance 2, which voltage is denoted by $V_{RL}$.

The controlled current source 3 serves to mitigate radiated radio-frequency interference in the on-chip supply line with a small voltage drop across the controlled current source 3. Crosstalk from interference on the supply voltage between function groups which are monolithically integrated together can be reduced particularly effectively. Comparatively high interference suppression values can also be achieved with audio-frequency interference, where voltage loss in the supply line is relatively low on account of the controlled current source.

When the circuit from FIG. 1 is integrated using a complementary metal oxide semiconductor, CMOS n-well process, the controlled current source 3 is advantageously in the positive power supply line as shown, whereas in a CMOS p-well process the controlled current source is advantageously in the negative power supply line.

FIG. 2 illustrates an equivalent circuit diagram for the crosstalk paths for interference on the supply voltage between individual, monolithically integrated electrical loads. In the illustrated example, the arrangement has three loads 2, 8, 9 produced using analog circuitry and three loads 10, 11, 12 integrated using digital circuitry. The three analog loads 2, 8, 9 are powered by an external supply voltage source 13, while the three loads 10, 11, 12 produced using digital technology are supplied by an external supply voltage source 14. In series with the supply voltage sources 13, 14, series resistances and series inductances are shown, since real, not ideal, sources are involved. The parasitic series resistance is denoted by reference symbols 15, 16, and the parasitic series inductance is denoted by 17, 18. The supply voltage provided by the source 13 is backed up by an off-chip backup capacitor 19 in the case of relatively high-frequency spikes carried by the loads 2, 8, 9, so that relatively high-frequency transient dynamic voltage drops across the parasitic series resistances 15, 16 are compensated for. However, apart from package connections on the integrated part, the supply of the supply voltage has the series inductance 17, 18, which is parasitic. Voltage drops across the series inductance 17, 18 as a result of high-frequency and very high-frequency transient fluctuations in the current carried by the on-chip loads 2, 8, 9 cannot be compensated for by the backup capacitor 19 which is on the board, however. This also applies to the voltage drops across bonding wires, which likewise have non-negligible series resistances and series inductances. These are denoted by reference symbols 20, 21, 22, 23. The values of the resistances and inductances 20 to 23 are dependent on wire length and wire diameter. The series resistances of the on-chip supply lines for the analog loads 2, 8, 9 are provided with reference symbols 4, 5, 24, 25, 26, 27.

Analogously, the bottom half of the image in FIG. 2 shows the equivalent circuit diagram according to which the voltage source 14 feeds the loads 10, 11, 12 integrated using digital technology.

In both cases, the package connections for the respective negative power supply connections are combined on the board at a common ground reference point GND via resistances 28, 29 which are as low as possible.

Additionally, since integrated structures have unavoidable, parasitic connections to the silicon substrate, there are substrate resistances 30, 31, 32, 33, 34, 35 which are combined at a common substrate connection SUBSTRATE. This means that the supply voltage lines bring about crosstalk from signals or interference. The substrate connection corresponds to the theoretical ground connection of the chip. The loads 2, 8, 9, 10, 11, 12 are therefore connected to the local ground reference with as low a resistance as possible so that the silicon substrate's potential is clearly defined locally and at the same time parasitic displacement currents are just local currents.

In FIG. 2, the load impedance 2 is operatively coupled to a controlled current source 3 as in FIG. 1. The functioning of this arrangement is akin to that of FIG. 1, and thus is not described in detail again for purposes of simplicity.

It will be appreciated that other electrical loads, such as loads 8, 9, 10, 11, 12 from FIG. 2, may be included in a circuit as illustrated in FIG. 1 to facilitate improved crosstalk suppression.

FIG. 3 illustrates a development of the circuit from FIG. 1 in which the controlled current source 3 is in the form of a MOS transistor 36. In this example, the source/drain path of the transistor couples the input 1 to the load impedance 2. The control voltage $U_{GS}$ is supplied to the controlled current source 36 by a control capacitor 37 and the charge stored thereon. The control capacitor 37 is connected between the gate connection and the source connection. In line with the proposed example, the quantity of charge on the control capacitor 37 and hence the control voltage $U_{GS}$ have been set by the control means 6' so that the drain/source voltage drop across the transistor in the current source 36 is high enough for the transistor to be at an operating point AP at which it can still be regarded as a current source.

Figure 4:
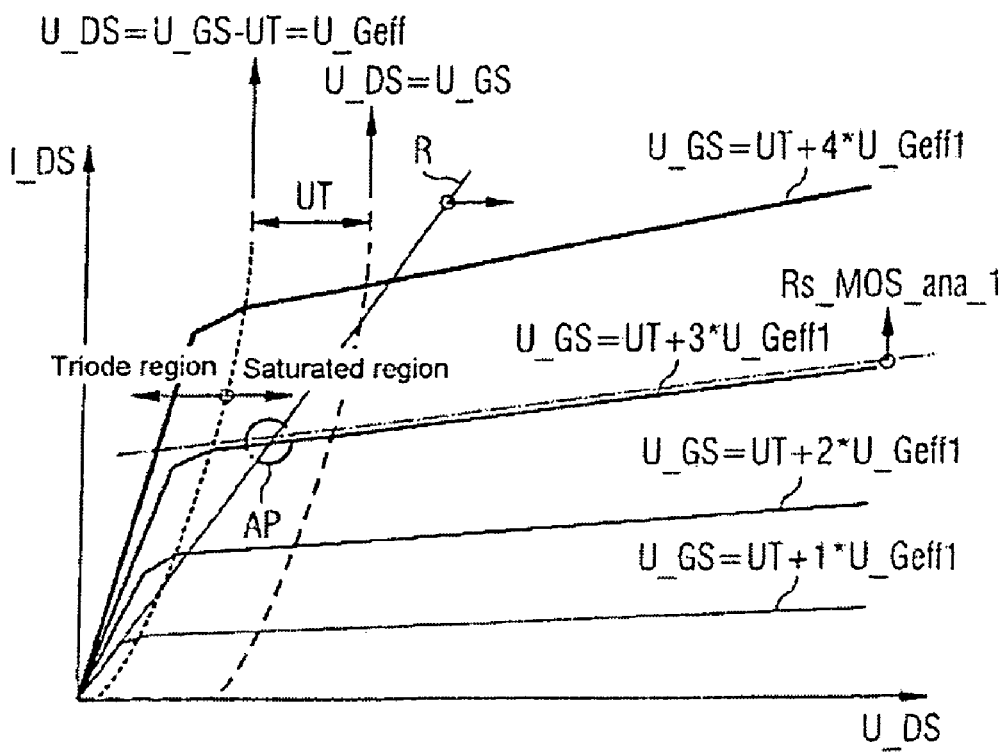
FIG. 4 graphically illustrates an output family of characteristic curves for a MOS transistor, such as that included in FIG. 3.

The operating point AP which has been set by the control means 6' from FIG. 3 is illustrated in FIG. 4.

More particularly, FIG. 4 illustrates the output family of characteristic curves for the MOS transistor in the controlled current source 36 on a qualitative basis. It shows the operating point AP, at which the voltage drop across the transistor in the current source 36 from drain to source is just a few hundred millivolts. The differential output resistance of the transistor is typically up to a factor of 100 greater than a series resistance, which would have the same voltage drop for the same current, however. The characteristic curve for such a resistance is likewise shown for illustrative purposes and is denoted by R. It can be seen that the approximately static drain current through the transistor in the current source 36 corresponds to the average current drawn by the analog load 2 and may typically be just a few hundred millivolts smaller than the input voltage for the circuit shown in FIG. 3.

Figure 5:
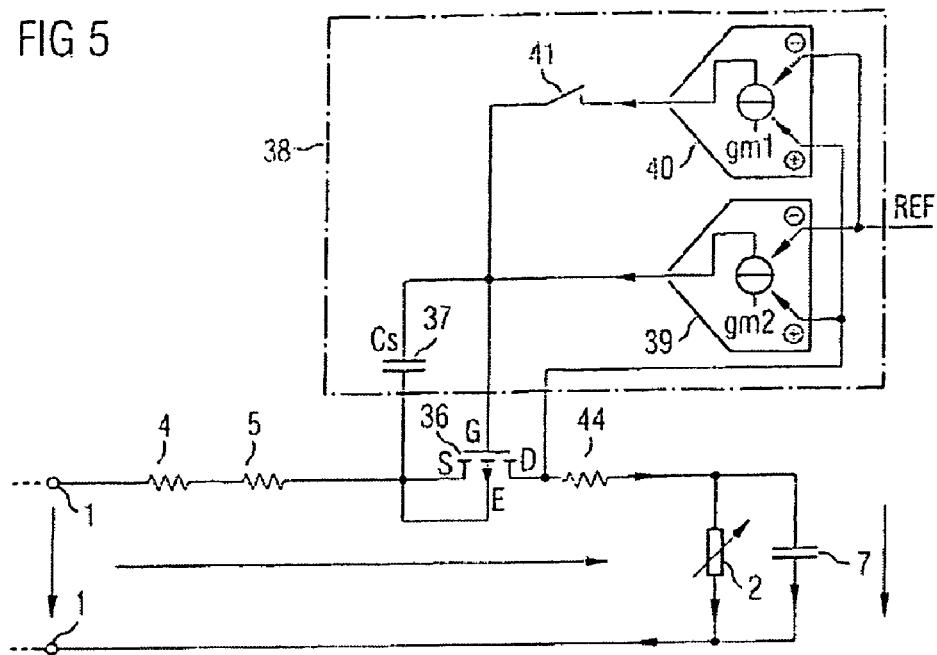
FIG. 5 is a schematic block diagram illustrating an exemplary circuit arrangement similar to that of FIGS. 1 to 3 where differential amplifiers are implemented.

FIG. 5 illustrates an example of the circuit from FIG. 3 which largely corresponds thereto in terms of the components used, the advantageous connections thereof and also its mode of action. In this regard, the description is not repeated at this juncture. In addition, to control the transistor in the controlled current source 36, there is a control means 38 which comprises two differential amplifiers in the form of differential amplifiers 39, 40. Furthermore, to improve stability, there is typically a low-value resistor 44 connected between the drain connection of the transistor in the controlled current source 36 and a connection on the load impedance 2.

The differential amplifier 39 has an output which is connected to the control input of the transistor in the controlled current source 36 and to a connection on the capacitor 37. The output of a further differential amplifier 40 is connected to the output of the differential amplifier 39 via a switch 41. The two noninverting inputs of the differential amplifiers 39, 40 are connected to the drain connection of the transistor in the controlled current source 36, while a reference signal REF is supplied to the two interconnected inputs of the differential amplifiers 39, 40, which are inverting. The quantity of charge Q on the control capacitor 37 is altered on the basis of the differential amplifiers 39, 40. The switch 41 can be used to turn off the influence of the second (transimpedance) amplifier 40 on the control capacitor 37. The gradient gm1 of the differential amplifier 40 is much greater than that of the second differential amplifier gm2, where the control gradient is defined as the ratio of the differential current change at the output and the differential voltage change at the input. The differential amplifiers 39, 40 are connected to one another and to the rest of the circuit such that the potential of the reference signal REF is transferred to the drain connection of the transistor in the current source 36.

The potential of the reference signal REF is typically chosen such that it is just a few hundred mV below the input voltage, which means that the transistor in the current source 36 merely operates as a current source. The control speed is dependent on the value of the gradient gm1, gm2 and on the value of the storage capacitor 37. The control time constant is calculated from the quotient of the control capacitor 37 divided by the gradient gm1, gm2. The steep gradient gm1 promotes fast settling. After the transient process, the switch 41 is opened, which means that only the control action with the gradient gm2 now remains. Taking into account the value of the control capacitor 37, the gradient gm2 is chosen in the same way as the average current drawn by the load 2 changes over time. When the switch 41 has been opened, the blocking action is at a maximum.

If the circuit in FIG. 5 is used with a load 2, for example, which operates only in time slices and is not continually turned on, the differential amplifier 39 can be dispensed with. Within a time slot, the switch 41 can be opened after settling has occurred.

If a circuit as illustrated in FIG. 5 is advantageously provided for each load 2, 8, 9 shown in FIG. 2, the crosstalk on the supply voltage reaches a minimum.

The control capacitor 37 is advantageously in the form of a MOS transistor.

Figure 6:
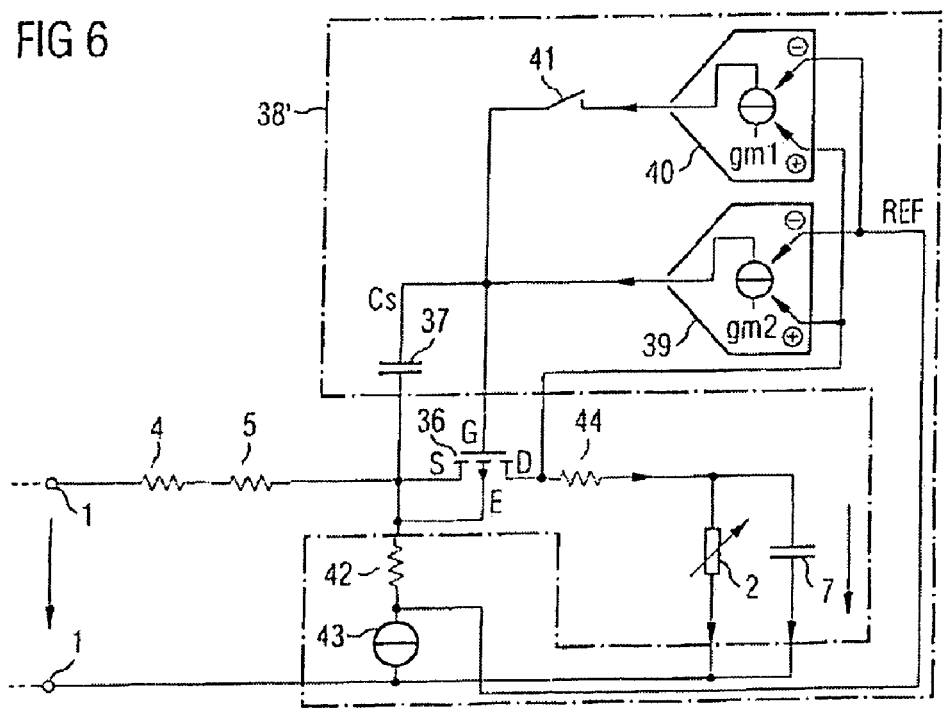
FIG. 6 is a schematic block diagram illustrating an exemplary circuit arrangement according to one or more aspects of the present invention where a reference variable is obtained to form a control loop.

FIG. 6 illustrates a development of the circuit from FIG. 5 which largely corresponds to it in terms of design and operation and in this regard is not described again at this juncture. To generate the reference signal REF, FIG. 6 has a series circuit, comprising a resistor 42 and a current source 43, connected to the input connection 1. The connecting node between the components 42, 43 has the reference signal input connected to it for supplying the reference signal REF for the differential amplifiers 39, 40. As a result, the potential of the reference signal is produced taking the positive supply voltage as reference.

Alternatively, the potential of the reference signal REF could also take negative supply voltage as reference.

The exemplary embodiments described are suitable for use in a CMOS n-well fabrication method. It goes without saying that the examples described may also be produced using complementary circuitry within the context of the invention, however. MOS current sources may also be produced using p-channel MOS transistors instead of n-channel MOS transistors. The level of the zero-field threshold voltage of the MOS transistors plays little to no part.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (e.g., assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising." Also, exemplary is merely intended to mean an example, rather than the best.

LIST OF REFERENCE SYMBOLS

1 Input connection
2 Load impedance
3 Controlled current source
4 Resistor
5 Resistor
6 Control means
6' Control means
7 Backup capacitor
8 Load impedance
9 Load impedance
10 Load impedance
11 Load impedance
12 Load impedance
13 Voltage source
14 Voltage source
15 Resistance
16 Resistance
17 Inductance
18 Inductance
19 Capacitor
20 Resistance
21 Resistance
22 Inductance
23 Inductance
24 Resistance
25 Resistance
26 Resistance
27 Resistance
28 Resistance
29 Resistance
30 Resistance
31 Resistance 32 Resistance
33 Resistance
34 Resistance
35 Resistance
36 Controlled current source
37 Control capacitor
38 Control means
39 OTA
40 OTA
41 Switch
42 Resistor
43 Current source
Vin Supply voltage
REF Reference voltage

The invention claimed is:

1. A circuit arrangement, comprising:
an input connection for supplying a supply voltage (Vin);
a load impedance;
a controlled current source which is coupled between the input connection of the circuit arrangement and the load impedance; and
a control means which has an output coupled to a control input of the controlled current source, wherein the control means is configured to output a control signal to the control input of the controlled current source based upon feedback received from a node located between the controlled current source and the load impedance, and wherein the controlled current source outputs a current which corresponds to the average current drawn by the load impedance based on the control signal.

2. The circuit arrangement of claim 1, wherein the control means comprises a control capacitor which couples the control input of the controlled current source to the input connection of the circuit arrangement.

3. The circuit arrangement of claim 1, wherein the controlled current source comprises a transistor which has a control connection (G) which forms the control input of the controlled current source and which has a controlled path (S, D) which is connected between the input connection of the circuit arrangement and the load impedance.

4. The circuit arrangement of claim 1, wherein a backup capacitor is provided which is connected in parallel with the load impedance.

5. The circuit arrangement of claim 4, wherein the backup capacitor is in the form of a metal oxide semiconductor transistor.

6. The circuit arrangement of claim 1, wherein the control means comprises a differential amplifier which has a first input for a reference signal (REF), a second input coupled to a load-impedance-side connection on the controlled current source to provide a voltage equal to the voltage drop across the load impedance, and an output connected to the control input of the controlled current source.

7. The circuit arrangement of claim 3, wherein the control means provides the reference signal (REF) at a value which is at a level such that the transistor in the controlled current source operates as a current source.

8. The circuit arrangement of claim 6, wherein a resistor is connected between the controlled current source and the load impedance.

9. The circuit arrangement of claim 6, wherein the control means comprises a reference signal generator which is coupled to the input connection of the circuit arrangement for outputting the reference signal (REF) on the basis of the supply voltage (Vin) for the circuit arrangement.

10. The circuit arrangement of claim 6, wherein the control means comprises a further differential amplifier which has a first input connected to the first input of the differential amplifier, a second input connected to the second input of the differential amplifier, and an output which is connected to the control input of the controlled current source via a switch.

11. The circuit arrangement of claim 10, wherein the differential amplifier has a transconductance (gm2) which is shallower than the transconductance (gm1) of the further differential amplifier.

12. The circuit arrangement of claim 1, wherein the circuit arrangement is monolithically integrated.

13. A method for reducing crosstalk, comprising:
providing a load impedance;
supplying a supply voltage (Vin) to the load impedance; and
controlling a current supplied to the load impedance such that the controlled current supplied to the load impedance corresponds to an average current drawn by the load impedance, wherein the average current drawn by the load impedance is determined by utilizing a feedback provided to a control means, for controlling the current.

14. The method of claim 13, wherein the current through the load impedance is controlled on the basis of the supply voltage (Vin) by means of capacitive coupling.

15. The method of claim 13, wherein the current through the load impedance is controlled using a transistor.

16. The method of claim 13, wherein the voltage across the load impedance has a capacitive backup.

17. The method of claim 16, wherein the capacitive backup for the voltage across the load impedance is provided by means of a metal oxide semiconductor transistor operating as a capacitor.

18. The method of claim 13, further comprising:
comparing a voltage drop across the load impedance with a reference voltage (REF) to produce a control signal; and
controlling current through the load impedance on the basis of the control signal.

19. The method of claim 18, wherein the reference voltage (REF) is provided such that the transistor controlling the current through the load impedance operates as a current source.

20. The method of claim 18, wherein the reference voltage (REF) is a function of the supply voltage (Vin).

21. A circuit arrangement, comprising:
an input connection for supplying a supply voltage (Vin);
a load impedance;
a controlled current source which is coupled between the input connection of the circuit arrangement and the load impedance; and
a control means which has an output coupled to a control input of the controlled current source, wherein the control means is configured to output a control signal to the control input of the controlled current source, and wherein the controlled current source outputs a current which corresponds to the average current drawn by the load impedance based on the control signal
wherein the control means comprises:
a first differential amplifier which has a first input for a reference signal (REF), a second input coupled to a load-impedance-side connection on the controlled current source, and an output connected to the control input of the controlled current source; and
a second differential amplifier selectively connected in parallel with the first differential amplifier.

* * * * *